May 21, 1968 J. J. KARDASH 3,384,766

BISTABLE LOGIC CIRCUIT

Filed June 17, 1966 3 Sheets-Sheet 1

INVENTOR.
JOHN J. KARDASH

BY David M. Keay
AGENT.

United States Patent Office 3,384,766

Patented May 21, 1968

3,384,766

BISTABLE LOGIC CIRCUIT

John J. Kardash, South Acton, Mass., assignor to Sylvania Electric Products Inc., a corporation of Delaware Filed June 17, 1966, Ser. No. 558,319
17 Claims. (Cl. 307—292)

Figure 1:
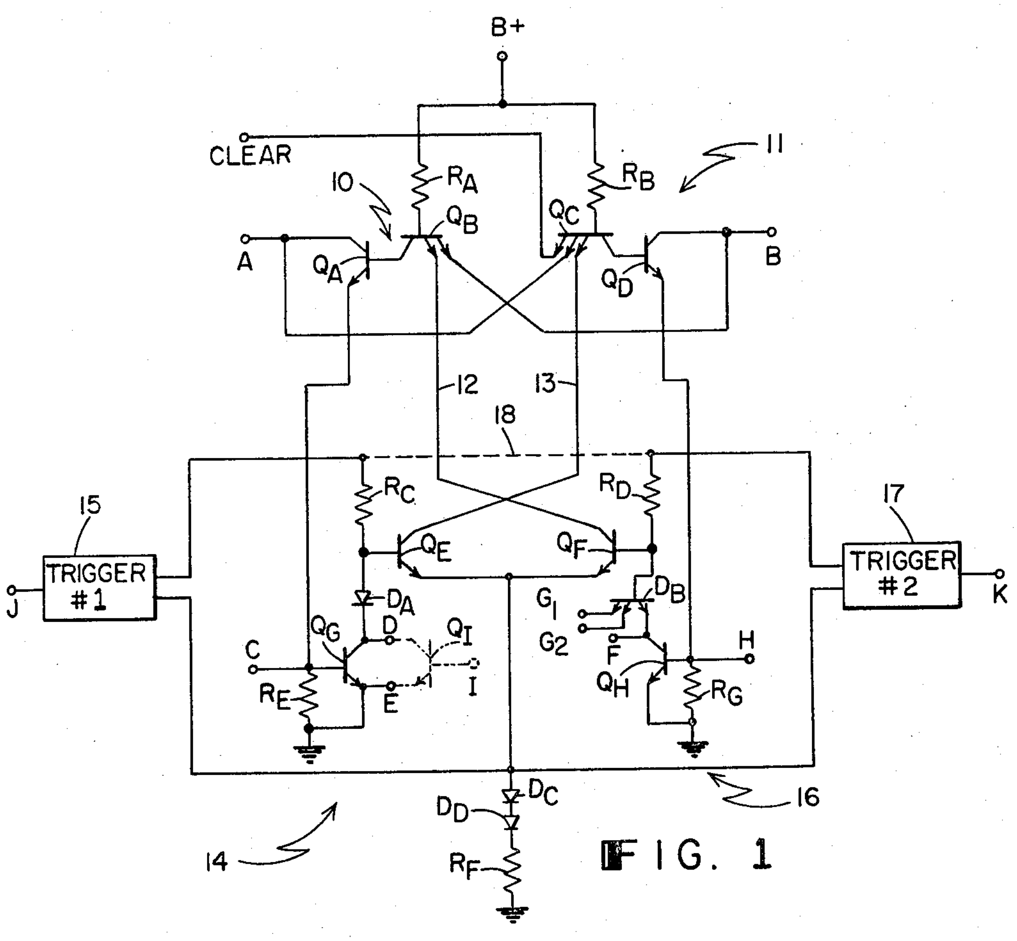

This invention relates to bistable logic circuits. More particularly, it is concerned with flip-flop circuits and with input circuits for controlling the operating states of flip-flop circuits.

Various types of bistable circuits are employed in digital computers and electronic data processing equipment in the performance of various logic functions. Several bistable circuits may be interconnected and provided with appropriate input and output connections in order to form counters, converters, shift registers, memories, or other logic subsystems.

Bistable circuits for use in logic subsystems have been designed and produced as monolithic integrated circuit networks having an entire flip-flop circuit fabricated within a single small chip of semiconductor material. Presently known techniques of fabricating monolithic integrated circuit networks are such that it has been feasible to design and manufacture circuits which are relatively complex and require additional active and passive circuit components in order to improve the performance characteristics of the circuit. The additional complexity adds little or nothing to the cost, size, or to problems of reliability and production yield.

The monolithic integrated circuit networks are individually mounted in enclosures which are appropriately connected to each other to provide desired logic subsystems. Each circuit must be capable of driving the load on its output including the effects created by the enclosure leads and their interconnections. The output of each circuit must otherwise be compatible with the input of the succeeding circuit. Thus, it is usually necessary to provide buffering and driving circuitry between bistable circuit stages, either within the same semiconductor chip as a portion of the bistable circuit or in separate chips in separate enclosures.

It is desirable further to extend the advantages of performance, reliability, and size obtained with monolithic integrated circuits by incorporating all of the circuitry for performing complex logic functions within a single chip of semiconductor material. However, existing high performance bistable circuits as fabricated in monolithic integrated circuit networks are relatively complicated and frequency require inter-stage coupling circuitry. In addition, a complete logic subsystem may require appropriate input gates to handle the input signals to the subsystem prior to processing by the bistable circuits together with all additional circuitry required to provide a complete logic subsystem may require a very large number of active and passive components. Although it is possible to fabricate all the components simultaneously within a single chip of semiconductor material, serious problems of interconnecting the components and dissipating the power consumed by the components are difficult to solve.

It is an object of the present invention, therefore, to provide an improved bistable circuit.

It is another object of the invention to provide a simplified, high speed, input circuit for controlling the operating state of a flip-flop circuit.

It is also an object of the invention to provide a simplified bistable logic circuit which is amenable to fabrication in multiple within a single chip of semiconductor material and which is adapted for use in logic subsystems completely fabricated within a single chip of semiconductor material.

Briefly, in accordance with the foregoing objects, a bistable logic circuit according to the invention includes a first and a second flip-flop section each having a first and a second operating condition and feedback connections between the two flip-flop sections to cause the sections to operate in different operating conditions. An input circuit for controlling the operating state of the flip-flop circuit has control input connections from each flip-flop section and output connections to each flip-flop section.

The input control circuit includes a first switching means connected to an output connection to the flip-flop circuit and having first and second input connections. The switching means produces a first signal condition at the output connection when in a first operating condition and produces a second signal condition at the output connection which is operable to change the operating state of the flip-flop circuit when in a second operating condition.

The control circuit also includes a first control means which is connected to a control input connection from the flip-flop circuit and to the first input connection to the switching means. The control means is operable in a high impedance condition in response to the presence of a first signal condition at the control input connection and is operable in a low impedance condition in response to a second signal condition at the control input connection. A first impedance means is also connected to the first input connection to the switching means.

A first triggering signal means is connected to the impedance means and also to the second input connection to the switching means. The triggering signal means, the impedance means, and the control means are operable to produce biasing conditions at the first and second input connections to the switching means so as to bias the switching means to the first operating condition during the absence of a signal at the triggering signal means; so as to bias the switching means to the first operating condition during the presence of a signal at the triggering signal means when the control means is in the low impedance condition; and to cause a charge to be stored in the switching means during the presence of a signal at the triggering signal means when the control means is in the high impedance condition. The switching means is operable to employ the stored charge to cause operation of the switching means in the second operating condition thereby changing the operating state of the flip-flop circuit, in response to termination of the signal at the triggering signal means.

A second section of the input control circuit includes similar circuit means which may be employed to reverse the operating state of the flip-flop circuit.

Figure 2:
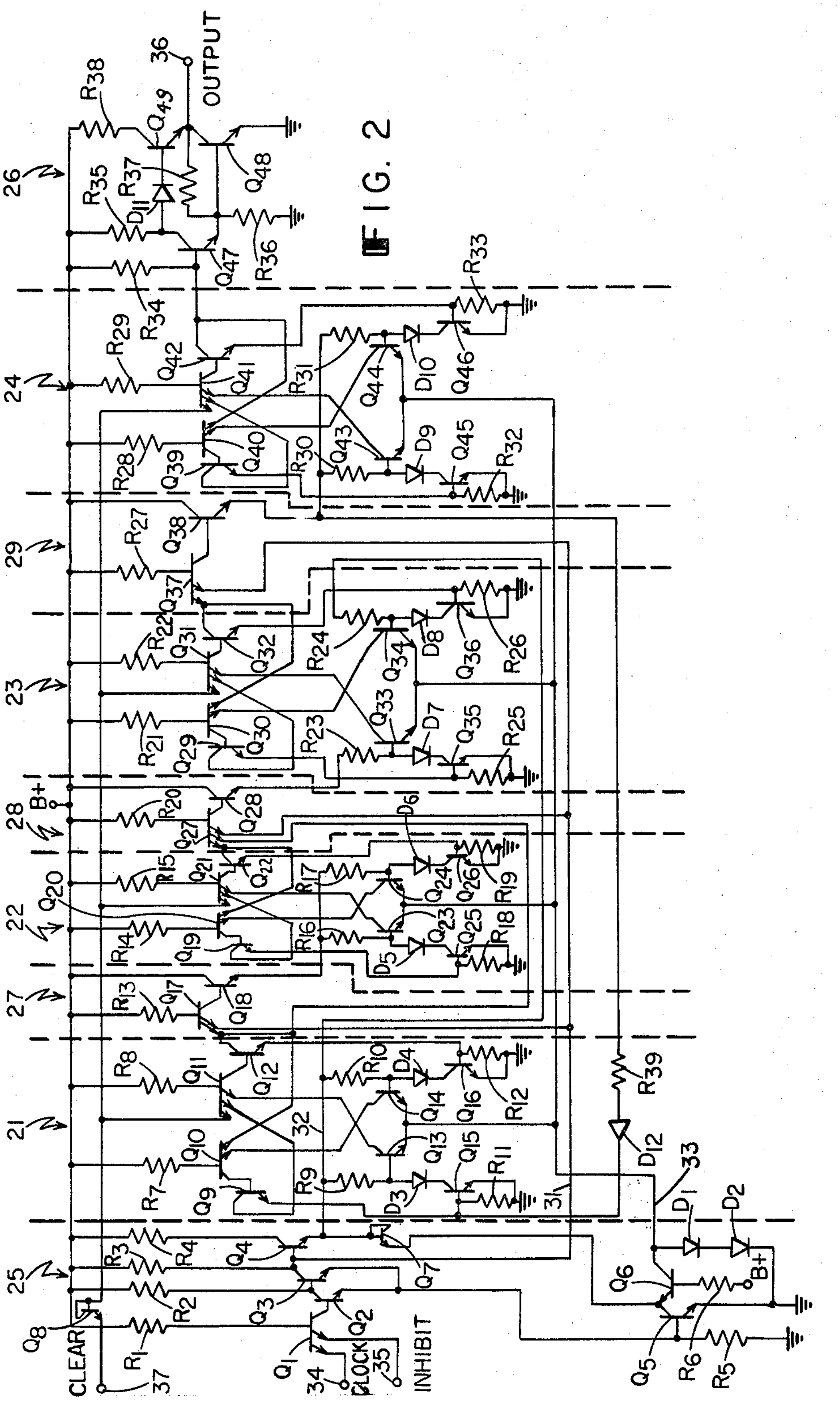
Figure 3:
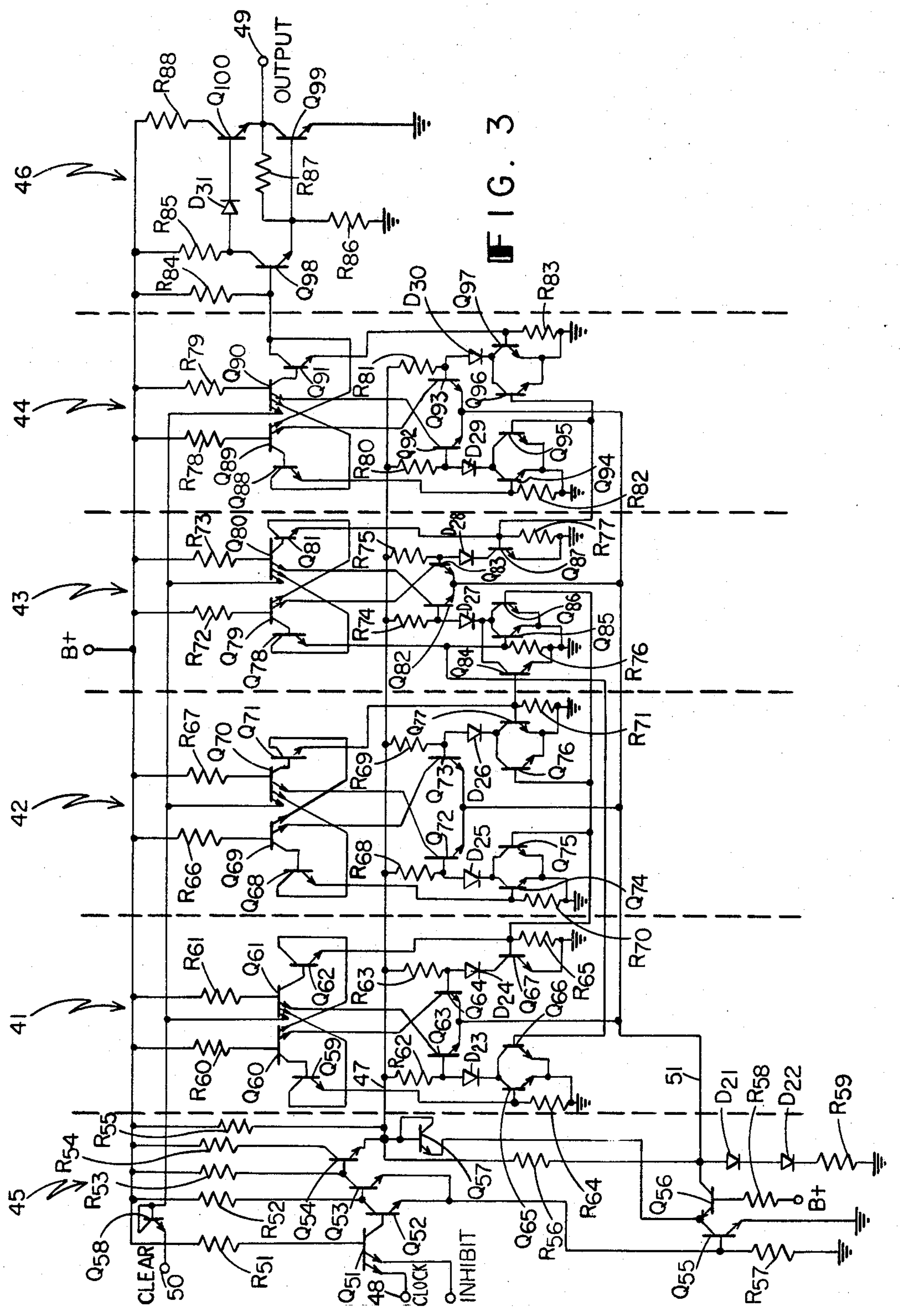

Additional objects, features, and advantages of bistable logic circuits according to the invention will be apparent from the following detailed discussion and the accompanying drawings wherein:

FIG. 1 is a schematic circuit diagram of a bistable circuit according to the invention showing appropriate connections and terminals applied thereto in order to facilitate an explanation of the circuit and its operation, FIG. 2 is a schematic circuit diagram of a frequency divider or counter circuit employing four stages of the basic bistable circuit of FIG. 1 together with an input circuit, an output circuit, and appropriate interconnections to provide a functional logic subsystem; and FIG. 3 is a schematic circuit diagram of a circuit employing four stages of the basic bistable circuit of FIG. 1, an input circuit, an output circuit, and a different pattern of interconnections from the circuit of FIG. 2 thereby utilizing certain features of the basic circuit of FIG. 1 to provide a frequency divider or counter circuit capable of performing the same logic function as the circuit of FIG. 2.

The bistable circuit according to the invention as shown in FIG. 1 is arranged primarily for purposes of explanation. Various terminals, connections, and circuit elements are shown which may or may not be included when the basic circuit is employed in a subsystem array. Various interconnections for arranging several of the basic circuits in a functional array are illustrated in the circuits of FIGS. 2 and 3.

*Bistable circuit of FIG. 1—General*

The bistable circuit of FIG. 1 includes two cross-coupled flip-flop sections 10 and 11 each having an input transistor $Q_B$ and $Q_C$ and a flip-flop transistor $Q_A$ and $Q_D$, respectively. The circuit has a first operating state during which the first flip-flop transistor $Q_A$ is in a heavily conducting condition and the second flip-flop transistor $Q_D$ is in a low or partially conducting condition, and a second operating state during which the first flip-flop transistor $Q_A$ is in a partially conducting condition and the second flip-flop transistor $Q_D$ is in a conducting condition. For convenience, a flip-flop section and its flip-flop transistor may be considered "on" when the flip-flop transistor is in the heavily conducting condition and "off" when the flip-flop transistor is in the partially conducting condition.

*Bistable circuit of FIG. 1—Description of flip-flop sections*

The first input transistor $Q_B$ is a duel emitter NPN transistor having its base connected through a resistance $R_A$ to a source of positive voltage labeled B+, and having its collector connected directly to the base of the first NPN flip-flop transistor $Q_A$. One of the emitters of input transistor $Q_B$ is connected directly to the collector of the second flip-flop transistor $Q_D$. The other emitter of input transistor $Q_B$ is connected to a first output connection line 12 from the input control portion of the bistable circuit.

The emitter of the first flip-flop transistor $Q_A$ is connected through a resistance $R_E$ to ground. The collector of the first flip-flop transistor $Q_A$ is connected directly to one of the emitters of the second NPN input transistor $Q_C$. One of the other two emitters of the second input transistor $Q_C$ is connected to a second output connection line 13 from the input control circuit. The third emitter of the second input transistor $Q_C$ is connected to a terminal labeled "clear" which may be employed to set the operating state of the flip-flop circuit. Normally the clear terminal is appropriately connected to cause a relatively high voltage at the emitter.

The base of the input transistor $Q_C$ is connected through a resistance $R_B$ to the voltage source B+. The collector of input transistor $Q_C$ is connected directly to the base of the second NPN flip-flop transistor $Q_D$ which, as previously mentioned, has its collector connected directly to one of the emitters of the first input transistor $Q_B$. The emitter of the second flip-flop transistor $Q_B$ is connected through a resistance $R_G$ to ground.

*Bistable circuit of FIG. 1—Operation of flip-flop sections*

The flip-flop circuit operates in the following manner, assuming the first flip-flop section 10 to be "on" and the second flip-flop section 11 to be "off." The second flip-flip transistor $Q_D$ is in the partially conducting condition, thus presenting a high impedance to current flow in one of the emitter circuits of the first input transisotr $Q_B$. Since the first output connection line 12 presents a high impedance to the other emitter, as will be explained below, there is no heavy current flow across the base-emitter junction of the transistor and the voltage at the base of the transistor is relatively high. Current flows in the collector circuit of the input transistor $Q_B$ and a relatively high voltage is established at the base of the first flip-flop transistor $Q_A$. Flip-flop transistor $Q_A$ is thereby biased to a conducting condition.

Current flow in the collector circuit of the first flip-flip transistor $Q_A$ causes heavy current flow across the forward biased base-emitter junction of the second input transistor $Q_C$. The voltagt drop across the base resistance $R_B$ produces a relatively low voltage at the base of input transistor $Q_C$. Although input transistor $Q_C$ is operating in saturation under these conditions, conduction in the collector circuit is slight and the voltage at the collector is low. The second flip-flop transistor $Q_D$ is thereby biased to apartially conducting condition. Thus, the conditions are such that operation of the flip-flop circuit in the first operating state is stable. The flip-flop circuit is also stable in the second operating state with conditions in the two sections reversed from those during operation in the first state.

*Bistable circuit of FIG. 1—Description of control circuit*

The flip-flop circuit is switched from one stable operating state to the other by the input control steering circuit. The first section 14 of the control circuit includes a first NPN switching transistor $Q_E$ having its collector connected directly to the output connection line 13 to the emitter of the second input transistor $Q_C$ and its emitter connected to ground through series connected diodes $D_C$ and $D_D$ and a resistance $R_F$. The base of the switching transistor $Q_E$ is connected through a diode $D_A$ to the collector of a first NPN control transistor $Q_G$. The emitter of the control transistor $Q_G$ is connected directly to ground and its base is connected directly to the emitter of the first flip-flop transistor $Q_A$. The base of switching transistor $Q_E$ is also connected to one end of a resistance $R_C$. A first source of trigger pulses 15 is connected to the other end of the resistance $R_C$ and also to the emitter of the switching transistor $Q_E$.

The second section 16 of the control input circuit similarly includes a second NPN switching transistor $Q_F$ having its collector connected directly to the output connection line 12 to the emitter of the first input transistor $Q_B$ and its emitter connected directly to the emitter of the first switching transistor $Q_E$. The base of the second switching transistor $Q_F$ is connected through a diode $D_B$ to the collector of a second NPN control transistor $Q_H$ and to one end of a resistance $R_B$. The diode $D_B$ is illustrated as a multiple diode having three emitters. Its base is connected directly to the base of the switching transistor $Q_F$ and the resistance $R_D$, and one of its emitters is connected directly to the collector of the control transistor $Q_H$. When no connection is made to the terminals $G_1$ and $G_2$ of the other two emitters, diode $D_B$ is equivalent to the diode $D_A$ of the first section of the control circuit. The base of control transistor $Q_H$ is connected directly to the emitter of the second flip-flop transistor $Q_D$ and its emitter is connected directly to ground. A second source of trigger pulses 17 has connections to the other end of the resistance $R_D$ and to the emitter of the switching transistor $Q_F$.

*Bistable circuit of FIG. 1—Operation of control circuit, charging action*

The control circuit operates in the following manner, again assuming that the flip-flop circuit is in the first operating state with the first flip-flop transistor $Q_A$ "on" and the second flip-flop transistor $Q_D$ "off." Current flow in the emitter circuit of the conducting flip-flop transistor $Q_A$ causes a voltage drop across resistance $R_E$ which biases the first control transistor $Q_G$ to the conducting condition. Control transistor $Q_G$ thus presents a low impedance, but because of the low voltage level at the connection line to the trigger source 15 substantially no current flows in the collector circuit. Since the second flip-flop transistor $Q_D$ is in the partially conducting condition, only a very small emitter current flows through the resistance $R_G$ and the potential at the base of the second control transistor $Q_H$ is sufficiently low to bias control transistor $Q_H$ to the non-conducting condition thus presenting a high impedance. In the absence of pulses from the sources of trigger pulses 15 and 17 the voltages at the bases and the emitters of both switching transistors $Q_E$ and $Q_F$ remain low, and each transistor is biased to a non-conducting condition. Thus, by means of the output connection lines 13 and 12 the switching transistors $Q_E$ and $Q_F$ present high impedances to current flow across the base-emitter junctions of input transistors $Q_C$ and $Q_B$, respectively.

When an input signal is applied at the input terminal J of the first trigger source 15, positive-going pulses occur at the connections to the resistance $R_C$ and to the emitter of switching transistor $Q_E$. Since the first control transistor $Q_G$ is biased to the conducting condition, current flows in its collector circuit. The greatest voltage drop occurs across the resistance $R_C$, and thus the potential at the base of the first switching transistor $Q_E$ does not rise appreciably. In addition, the potential at the emitter of the switching transistor $Q_E$ rises until the series arrangement of diodes $D_C$ and $D_D$ and resistance $R_F$ conducts and clamps the emitter at a predetermined voltage level. Thus, the base-to-emitter biasing conditions on the first switching transistor $Q_E$ are such as to maintain the transistor in the non-conducting condition during the presence of the input trigger signal.

When an input signal is applied at the input terminal K of the second trigger source 17, positive-going pulses occur at the connections to the resistance $R_D$ and to the emitter of the second switching transistor $Q_F$. Since the non-conducting control transistor $Q_H$ presents a high impedance, the potentials at both the base and the emitter of the switching transistor $Q_F$ rise during the first portion of the signal. After the potential at the emitter of the switching transistor $Q_F$ becomes clamped by the action of the conducting diodes $D_C$ and $D_D$, continued increase of the potential at the base of the switching transistor $Q_F$ forward biases the base-emitter junction. Although switching transistor $Q_F$ becomes saturated, the potential at which the emitter is clamped is sufficiently high relative to the potential at the collector, as established by the voltage drop across resistance $R_A$ and the base-emitter junction of input transistor $Q_B$, so that current does not flow out of the emitter of input transistor $Q_B$ into the collector of switching transistor $Q_F$. These biasing conditions at the base and emitter of the switching transistor $Q_F$ cause electrical energy to be stored in that transistor.

*Bistable circuit of FIG. 1—Operation of control circuit, switching action*

During the trailing edge of the pulse from the second source 17, the potential at the emitter of the switching transistor $Q_F$ decreases sufficiently relative to the potential at the collector so that the charge stored in the base-emitter junction during the pulse causes current to flow out of the emitter of the input transistor $Q_B$ into the collector of the switching transistor $Q_F$. Since the switching transistor is already in saturation, current flow is initiated very rapidly without dissiplating the charge forward biasing the base-emitter junction. A low impedance path is thus presented at the emitter of the first input transistor $Q_B$ and current flows from the B+ voltage source through the resistance $R_A$ and across the base-emitter junction of transistor $Q_B$ to the collector of transistor $Q_F$.

As current flows across the base-emitter junction of the first input transistor $Q_B$, the greatest voltage drop occurs across the resistance $R_A$ thus reducing the potential at the base of the input transistor $Q_B$. Although under these conditions the input transistor $Q_B$ operates in saturation, conduction in the collector circuit is slight and the potential at the collector becomes relatively low. The change in conditions at the base of the first flip-flop transistor $Q_A$ causes that transistor to become non-conducting. Thus, current flow from the voltage source B+ through the resistance $R_B$ and across the base-emitter junction of the second input transistor $Q_C$ to the collector of the first flip-flop transistor $Q_A$ is reduced.

Since the other two emitters of the second input transistor $Q_C$ are connected to high impedances, the reduced current flow through resistance $R_B$ causes the potential at the base of the input transistor $Q_C$ to increase. Current flow increases in the collector circuit of the input transistor $Q_C$ biasing the second flip-flop transistor $Q_D$ to a heavily conducting condition. Current in the collector circuit of the flip-flop transistor $Q_D$ flows from the voltage source B+ through the resistance $R_A$ and across the forward biased base-emitter junction of the first input transistor $Q_B$.

After the switching transistor $Q_F$ reverts to the non-conducting condition and presents a high impedance to the other emitter of the input transistor $Q_B$, fairly heavy current continues to flow through the resistance $R_A$ and across the input transistor $Q_B$. Under these conditions the limited current flow from the collector of input transistor $Q_B$ into the base of flip-flop transistor $Q_A$ holds transistor $Q_A$ in the partially conducting condition. In this manner, the action initiated by current flow in the collector circuit of the switching transistor $Q_F$ switches the flip-flop circuit to the second operating state with the first flip-flop transistor $Q_A$ "off" and the second flip-flop transistor $Q_D$ "on."

With the second flip-flop transistor $Q_D$ in the conducting condition, current flows in its emitter circuit through resistance $R_G$. The voltage drop across $R_G$ biases the second control transistor $Q_H$ to the conducting condition. The control transistor $Q_H$ thus presents a low impedance at the base of the second switching transistor $Q_F$. Any charge remaining in the base-emitter junction of the switching transistor $Q_F$ is discharged to the collector of the control transistor $Q_H$, and the switching transistor $Q_F$ is biased to the non-conducting condition.

Since the first flop-flop transistor $Q_A$ is no longer in the heavily conducting condition, the potential at its emitter is very low and the first control transistor $Q_G$ becomes biased to the non-conducting condition. Thus, the operating condition in the section of the control circuit are reversed by the change in the operating state of the flip-flop. The first control transistor $Q_G$ is biased to the high impedance condition, the second control transistor $Q_H$ is biased to the low impedance condition, and both switching transistors $Q_E$ and $Q_F$ are biased to the non-conducting condition. Under these conditions a signal at input terminal K has no effect on the operating state of the circuit, but a signal at input terminal J will cause a charge to be stored in the first switching transistor $Q_E$ and upon termination of the signal the stored charge will trigger the flip-flop circuit to the first operating state.

*Bistable circuit of FIG. 1—Single trigger source*

Although for purposes of explanation the pulses for triggering the flip-flop circuit are shown as being produced by two separate sources 15 and 17, it is possible to operate the circuit with only a single source of trigger pulses. For example, the second source 17 and the lines connecting it to the emitters of the switching transistors $Q_E$ and $Q_F$ and to the end of the resistance $R_D$ may be eliminated and a direction connection 18, indicated in phantom in FIG. 1, provided between the ends of the resistance $R_C$ and $R_D$. With these connections each input signal causes the flip-flop circuit to complement, or change operating state.

When the trigger pulse is applied to the two resistances $R_C$ and $R_D$, current flows through the resistance connected to the collector of the control transistor in the low impedance condition and through the transistor without affecting the associated switching transistor. Current flow through the other resistance causes a charge to be stored in the base-emitter junction of the associated switching transistor because of the high impedance condition of the non-conducting control transistor. Upon termination of the pulse, the stored charge forward biases the switching transistor causing conduction in its collector circuit. The diode $D_A$ or $D_B$ in the opposite section of the control circuit limits the recovery current which tends to flow to the switching transistor through the resistances $R_C$ and $R_D$. Thus the stored charge is not unduly dissipated before it can initiate switching of the flip-flop circuit to the other operating state.

It can be seen from the foregoing explanation that the control circuit operates to store a charge in the switching transistor during the leading edge of a trigger pulse, unless this action is inhibited by virtue of the associated control transistor being in the low impedance condition. As explained, one of the control transistors is biased to the low impedance condition by current flow through resistance $R_E$ or $R_G$ in the emitter circuit of the conducting flip-flop transistor $Q_A$ or $Q_D$.

*Bistable circuit of FIG. 1—Inhibiting arrangements*

A low impedance path between the base of the switching transistor and ground may also be provided by additional inhibiting arrangements. An inhibiting transistor $Q_I$, indicated in phantom in FIG. 1, may be connected to terminals D and E with its collector connected directly to the collector of the control transistor $Q_G$ and its emitter connected directly to the emitter of the control transistor $Q_G$. The inhibiting transistor $Q_I$ is biased to the conducting condition by an appropriate signal applied at its base by means of the input terminal I.

Thus, although the first flip-flop transistor $Q_A$ is "off" biasing the control transistor $Q_G$ to the non-conducting condition, the inhibiting transistor $Q_I$ may be biased to the conducting condition. Under these conditions a trigger pulse has no effect on the operating state of the flip-flop circuit. During the pulse, current flows through the resistance $R_C$ and the collector on the inhibiting transistor $Q_I$ and no charge is stored in the switching transistor $Q_E$.

A suitable signal for controlling the conducting condition of an inhibiting transistor $Q_I$ of one flip-flop circuit may be obtained by connecting its input terminal I directly to terminal C or H of another flip-flop circuit. Thus, the inhibiting transistor $Q_I$ of the one flip-flop circuit is biased to the same conduction condition as the control transistor $Q_G$ or $Q_H$ of the other flip-flop circuit. This feature which enables direct interconnections between a plurality of flip-flop circuits may be utilized as shown hereinbelow in discussing the frequency divider of FIG. 3 to provide arrays capable of performing complex logic functions.

Another inhibiting arrangement may be provided by the use of a multiple diode between the base of the switching transistor and the collector of the control transistor as illustrated by diode $D_B$. When a low impedance signal condition is presented at either of the emitter terminals $G_1$ or $G_2$, the effect on the second section of the control circuit is the same as when control transistor $Q_H$ is in the low impedance condition. By connecting one of the emitter terminals $G_1$ or $G_2$ of one bistable circuit directly to terminal D or F of another bistable circuit, the associated switching transistor $Q_F$ of the one bistable circuit is inhibited from storing a charge when the control transistor $Q_G$ or $Q_H$ of the other bistable circuit is in the low impedance condition, regardless of the operating condition of the associated control transistor $Q_H$ of the one bistable circuit.

*Decade frequency divider of FIG. 2—General*

FIG. 2 illustrates an array of four bistable circuits 21, 22, 23, and 24 according to FIG. 1 arranged as a decade frequency divider. The logic subsystem as shown in FIG. 2 also includes a pulse shaping input circuit 25, an output circuit 26, and three gate circuits 27, 28, and 29 coupling adjacent bistable stages.

*Decade frequency divider of FIG. 2—Input circuit*

The input circuit 25 produces positive-going pulses having sharp leading and trailing edges at first, second, and third connection lines 31, 32, and 33 during the occurrence of a positive-going input signal at the clock pulse input terminal 34. The first connection line 31 is connected directly to sections of the control circuits of certain bistable stages. The second connection line 32 is connected directly to the three gate circuits 27, 28, and 29, and the third connection line 33 is connected directly to the emitters of both switching transistors in each bistable stage.

When the clock input terminal 34 is at a low potential during the absence of an input signal, current flows from voltage source B+ through a resistance $R_1$ and across the base-emitter junction of the multiple-emitter NPN input transistor $Q_1$. The greatest voltage drop is across the resistance $R_1$ and the input transistor $Q_1$ is biased to a condition in which negligible current flows in the collector circuit, although the transistor is in saturation.

Thus, the next transistor $Q_2$ is biased to a low conduction condition establishing a relatively high voltage at its collector and at the base of the following transistor $Q_3$. Transistor $Q_3$ is biased to a high conduction condition, and the resulting voltage drop across the resistance $R_3$ is such that a relatively low voltage is present at the first output connection line 31 and the output transistor $Q_4$ is biased to a low conduction condition.

Current flow in the emitter circuit of transistor $Q_3$, which is in a high conduction condition, flows through the resistance $R_5$ establishing a potential difference which biases transistor $Q_5$ to a high conduction condition. Current flows from the voltage source B+ through the base resistance $R_6$ and across the base-emitter junction of an output transistor $Q_6$ to the collector of transistor $Q_5$. These conditions produce a relatively low potential at the emitter of output transistor $Q_6$ and also at the collector which is connected to the third output connection line 33. By virtue of the low conducting condition of output transistor $Q_4$ and the low voltage at the collector of transistor $Q_5$, the second output connection line 32 is also at a low voltage level.

When a positive-going signal is applied at the clock input terminal 34, assuming a low voltage signal condition is not present at the inhibit terminal 35, current flow through the resistance $R_1$ and across the base-emitter junction of the input transistor $Q_1$ is reduced. The potential at the base of transistor $Q_1$ increases causing current to flow in the collector circuit to the base of the next transistor $Q_2$. As conduction increases in transistor $Q_2$, the potential at its collector decreases lowering the potential at the base of the following transistor $Q_3$ and thereby reducing conduction in that transistor.

The arrangement of the three resistances $R_2$, $R_3$, and $R_5$ is such that as conduction increases in transistor $Q_2$ and decreases in the following transistor $Q_3$, the biasing conditions change so as to further increase conduction in transistor $Q_2$ and decrease conduction in transistor $Q_3$. This regenerative action is initiated when the clock pulse at the input terminal has become sufficiently positive to cause current flow in the collector circuit of the input transistor $Q_1$. Once the action has been initiated, it takes place very rapidly regardless of the shape of the incoming pulse at the clock input terminal. The reduced conduction in transistor $Q_3$ increases the voltage at the first output connection line 31 and biases the output transistor $Q_4$ to a high conduction condition.

By virtue of the resistance values of the three resistances $R_2$, $R_3$, and $R_5$ current flow through resistance $R_5$ is reduced as conduction in transistor $Q_2$ increases and conduction in transistor $Q_3$ decreases. Transistor $Q_5$ is thus biased to a low conduction condition. As conduction across the base-emitter junction of output transistor $Q_6$ to the collector of transistor $Q_5$ decreases the potential at the collector of the output transistor $Q_6$ and at the third output connection line 33 tends to increase. The two diodes $D_1$ and $D_2$ connected in series between the collector of the output transistor $Q_6$ and ground serve to clamp the voltage at the third output connection line 33 after it has risen to a predetermined desired level. Since output transistor $Q_4$ is operating in the high conduction condition and transistor $Q_5$ is in a low conduction condition, the potential at the second output connection line 32 connected to the emitter of output transistor $Q_4$ is relatively high.

*Decade frequency divider of Fig. 2—Gate circuits*

Each of the three gate circuits 27, 28, and 29 includes an NPN multiple emitter input transistor $Q_{17}$, $Q_{27}$, and $Q_{37}$ and an NPN output transistor $Q_{18}$, $Q_{28}$, and $Q_{38}$, respectively. The base of each input transistor, for example transistor $Q_{17}$ in the first gate circuit 27, is connected through a resistance $R_{13}$ to the voltage source B+ and the collector is connected directly to the base of the associated output transistor $Q_{18}$. Each of the emitters of the input transistor $Q_{17}$ is connected to a point in the subsystem circuitry which can present either a high or a low impedance to current flow across the base-emitter junction of the transistor depending upon the occurrence of various conditions throughout the subsystem. The collector of the output transistor $Q_{18}$ is connected directly to the B+ voltage source and the emitter is connected to the control circuit of the second bistable stage 22.

The combination of input transistor $Q_{17}$ and output transistor $Q_{18}$ operates in a similar manner to the combination of input transistor and flip-flop transistor in each section of each bistable stage and to the input transistor $Q_1$ and next transistor $Q_2$ of the input circuit 25. When a low impedance is presented to one or more of the emitters of the input transistor $Q_{17}$, heavy current flow across the base-emitter junction and through the base resistance $R_{13}$ prevents current flow in the collector circuit. The output transistor $Q_{18}$ is thus biased to a substantially non-conducting condition and the potential at its emitter is relatively low. When a high impedance is presented to all the emitters of the input transistor $Q_{17}$, current flow in the collector circuit of the input transistor $Q_{17}$ biases the output transistor $Q_{18}$ to conduction and increases the potential at its emitter.

*Decade frequency divider of Fig. 2—Output circuit*

The output circuit 26 provides a buffer isolating the bistable circuits of the subsystem from the output load connected to the output terminal 36. The output circuit includes an NPN input transistor $Q_{47}$ having its base connected directly to the collector of the second flip-flop transistor $Q_{42}$ of the fourth bistable circuit 24 and through a resistance $R_{34}$ to the B+ voltage source. Its collector is connected to the B+ voltage source through a resistance $R_{35}$ and its emitter is connected to ground through a resistance $R_{36}$. The emitter of the input transistor $Q_{47}$ is also connected directly to the base of an NPN output transistor $Q_{48}$. The collector of the output transistor $Q_{48}$ is connected directly to the subsystem output terminal 36 and its emitter is connected directly to ground. A biasing resistance $R_{37}$ is connected between the collector and base of the output transistor $Q_{48}$. A voltage setting transistor $Q_{49}$ has its base connected to the collector of the input transistor $Q_{47}$ through a diode $D_{11}$, its collector connected to the voltage source B+ through a resistance $R_{38}$, and its emitter connected directly to the output terminal 36.

When the second flip-flop transistor $Q_{42}$ of the fourth bistable stage 24 is in the partially conducting condition, the potential at its collector is relatively high and the input transistor $Q_{47}$ of the output circuit 26 is biased to conduction. Current flow through the input transistor $Q_{47}$ and the series connected resistances $R_{35}$ and $R_{36}$ produces a relatively low voltage at the collector and a relatively high voltage at the emitter. Thus, the output transistor $Q_{48}$ is biased to a high conduction condition providing a low impedance path between the output terminal 36 and ground and establishing a low voltage level at the output terminal. The relatively low voltage at the base of the voltage setting transistor $Q_{49}$ maintains that transistor in a substantially non-conducting condition.

When the second flip-flop transistor $Q_{42}$ of the fourth bistable stage 24 is switched to the heavily conducting condition, a relatively low potential is established at the base of the input transistor $Q_{47}$ and the series connected resistances $R_{35}$ and $R_{36}$ decreases, the voltage at the collector increases and that at the emitter decreases. The reduced voltage at the emitter of the input transistor $Q_{47}$ biases the base of the output transistor $Q_{48}$ so as to render that transistor substantially non-conducting. The output transistor $Q_{48}$ thus presents a high impedance between the output terminal 36 and ground.

The increased voltage at the base of the voltage setting transistor $Q_{49}$ together with the low voltage present at its emitter biases the voltage setting transistor $Q_{49}$ to a conducting condition. This transistor conducts heavily to drive the load on the output until the voltage at the output terminal 36 reaches a predetermined high level established by the voltage of the B+ source less the leakage current voltage drop across the resistance $R_{35}$, the diode $D_{11}$, and the base-emitter junction of voltage setting transistor $Q_{49}$. Restoration of the voltage at the output terminal to this higher level biases the voltage setting transistor $Q_{49}$ to a substantially non-conducting condition.

*Decade frequency divider of FIG. 2—Operation*

Briefly, the frequency divider subsystem of FIG. 2 operates to produce a square wave signal at the output terminal 36 at one-tenth the frequency of the clock pulse signal at the input terminal 34. When a low voltage approaching ground is temporarily applied at the clear terminal 37, each of the four flip-flop stages 21, 22, 23, and 24 is caused to operate in the first operating state with its second flip-flop transistor $Q_{12}$, $Q_{22}$, $Q_{32}$, and $Q_{42}$ "off." A low voltage level occurs at the output terminal 36.

When a first positive-going input pulse is applied to the input terminal 34 it is shaped by the input circuit 25 to produce positive-going pulses having relatively steep leading and trailing edges at the output connection lines 31, 32, and 33. Since the multiple-emitter input transistors $Q_{17}$, $Q_{27}$, and $Q_{37}$ of the gate circuits 27, 28 and 29 are connected to these connection lines and to the collectors of second flip-flop transistors $Q_{12}$, $Q_{22}$, and $Q_{32}$ which are "off," a signal is provided to the second section of the control circuit of each of the bistable stages. Since each of the second control transistors $Q_{16}$, $Q_{26}$, $Q_{36}$, and $Q_{46}$ is biased to a high impedance condition by virtue of being connected to the emitters of the second flip-flop transistors which are "off," a charge is stored in each of the second switching transistors $Q_{14}$, $Q_{24}$, $Q_{34}$, and $Q_{44}$. Upon termination of the first input pulse, each of the bistable stages is switched to the second operating state with each of the first flip-flop transistors $Q_9$, $Q_{19}$, $Q_{29}$, and $Q_{39}$ "off" and each of the second flip-flop transistors $Q_{12}$, $Q_{22}$, $Q_{32}$, and $Q_{42}$ "on." The high output voltage level is produced at the output terminal 36.

The second input pulse is effective to switch only the first bistable stage turning the first flip-flop transistor $Q_9$ "on" and the second flip-flop transistor $Q_{12}$ "off." Since the second flip-flop transistor $Q_{42}$ of the fourth stage 24 remains "on," the voltage at the output terminal 36 remains at the high level.

The third input pulse causes the first and second bistable stages 21 and 22 to reverse their operating states so that the first stage 21 is in the second operating state and the second stage 22 is in the first operating state. The fourth input pulse switches only the first stage 21 so that the first and second stages 21 and 22 operate in the first operating state while the third and fourth stages 23 and 24 continue to operate in the second operating state. The fifth input pulse affects the first, second, and third stages 21, 22, and 23 causing them to reverse operating conditions. Thus, the third stage 23 operates in the first operating condition and the first, second, and fourth stages 21, 22, and 24 operate in the second operating condition. From the first input pulse through the fifth pulse the fourth stage 24 operates in the second operating state with its second flip-flop transistor $Q_{42}$ "on." Therefore, the voltage at the output terminal 36 remains at the high level through the fifth pulse.

Because both sections of the control circuit of the first bistable stage 21 are connected to the second output connection line 32 from the input circuit 25, the sixth input pulse tends to reverse the operating state of the first stage 21. However, by virtue of the connection of the input transistor $Q_{37}$ of the third gate circuit 29 to the second flip-flop transistor $Q_{32}$ of the third bistable stage 23 which is "off," a positive signal is produced at the emitter of the gate output transistor $Q_{38}$. This signal is conducted to the base of the first control transistor $Q_{15}$ of the first bistable stage 21 by an inhibiting connection including a resistance $R_{39}$ and a diode $D_{12}$ in series. Current flow through the resistance $R_{11}$ biases the first control transistor $Q_{15}$ to a low impedance condition regardless of the fact that the first flip-flop transistor $Q_9$ is "off." Therefore, since both control transistors $Q_{15}$ and $Q_{16}$ of the first bistable stage 21 are in the low impedance condition, the sixth pulse does not change the operating state of the first bistable stage 21. The operating states of the third and fourth stages 23 and 24 are reversed, however. Thus, the first, second, and third stages 21, 22, and 23 operate in the second operating state and the fourth stage 24 operates in the first operating state. Since the second flip-flop transistor $Q_{42}$ of the fourth stage 24 is switched "off," the output voltage at the output terminal 36 changes to the low level.

The seventh input pulse affects only the first bistable stage 21 causing the first and fourth stages 21 and 24 to operate in the first operating state and the second and third stages 22 and 23 to operate in the second operating state. The eighth input pulse reverses the operating states of the first and second stages 21 and 22, and the ninth input pulse again reverses the operating state of the first stage 21. The tenth input pulse affects the first, second, and third stages 21, 22, and 23 causing the first and second stages 21 and 22 to operate in the second operating state and the third and fourth stages 23 and 24 to operate in the first operating state. Since the fourth bistable stage 24 is switched to the first operating state by the sixth input pulse and remains in that state through the tenth pulse, the output terminal 36 remains at the low voltage level through the tenth input pulse.

The eleventh input pulse reverses the operating states of the third and fourth stages 23 and 24 so that all four stages are caused to operate in the second operating state with the second flip-flop transistors $Q_{12}$, $Q_{22}$, $Q_{32}$, and $Q_{42}$ "on." The voltage level at the output terminal 36 is thus changed to the high voltage level. These conditions are the same operating conditions as those occurring subsequent to the first input pulse. Thus, it can be seen that the subsystem of FIG. 2 produces square wave output pulses at the output terminal 36 at one-tenth the frequency of the input pulses applied at the input terminal 34.

*Decade frequency divider of Fig. 3—General*

FIG. 3 illustrates another version of a decade frequency divider employing the basic circuit of FIG. 1 in four bistable stages 41, 42, 43, and 44. The subsystem also includes an input circuit 45 and an output circuit 46 which are generally similar to those in FIG. 2. However, connections between the bistable stages are simplified eliminating the gate circuits of FIG. 2. Each input pulse causes a switching signal to be applied to both sections of the control circuit of each bistable stage by means of the connection lines 47 and 51. Appropriate inhibiting connections are provided by connections from the emitters of flip-flop transistors to inhibiting transistors shunted across the primary control transistors of other stages in order to suppress switching action under certain conditions. Input signals applied to the input signal terminal 48 cause the bistable stages 41, 42, 43, and 44 to switch through the same sequence of operating states as the bistable stages of the subsystem of FIG. 2 to produce square wave pulses at the output terminal 49 at one-tenth the frequency of the applied input pulses.

*Decade frequency Divider of Fig. 3—Operation*

When the potential at the clear input terminal 50 is lowered, each of the bistable stages 41, 42, 43, and 44 is set to the first operating state with the first flip-flop transistors $Q_{59}$, $Q_{68}$, $Q_{78}$, and $Q_{88}$ "on" and the second flip-flop transistors $Q_{62}$, $Q_{71}$, $Q_{81}$, and $Q_{91}$ "off." A low voltage level is thus produced at the output terminal 49. Since all of the control transistors $Q_{67}$, $Q_{77}$, $Q_{87}$, and $Q_{97}$ and inhibiting transistors $Q_{76}$ and $Q_{96}$ in the second sections of the control circuits are connected to second flip-flop transistors which are "off" and are therefore in the high impedance condition, a first input signal at the clock input terminal 48 switches all the bistable stages to the second operating condition. With the second flip-flop transistor $Q_{91}$ of the fourth stage 44 "on," a high voltage level is produced at the output terminal 49.

Subsequent to the first input pulse, control transistor $Q_{65}$ and inhibiting transistor $Q_{66}$ in the first section of the control circuit of the first bistable stage 41 are connected to the emitters of first flip-flop transistors $Q_{59}$ and $Q_{78}$, respectively, which are "off." Therefore, control transistors $Q_{65}$ and $Q_{66}$ are in the high impedance condition. However, inhibiting transistors $Q_{75}$, $Q_{84}$, and $Q_{86}$, and $Q_{95}$ in in the first sections of the control circuits of the second, third, and fourth stages are connected to second flip-flop transistors $Q_{62}$, $Q_{71}$, and $Q_{91}$ which are "on." Therefore, inhibiting transistors $Q_{75}$, $Q_{84}$, $Q_{86}$, and $Q_{95}$ are in the low impedance condition even though the primary control transistors $Q_{74}$, $Q_{85}$, and $Q_{94}$ are in the high impedance condition. The second input pulse, therefore, causes the first stage to switch to the first operating state while the other three stages continue to operate in the second operating state.

The inhibiting connections are such that during the third, fourth, and fifth input pulses the operating states of the bistable stages change in the same sequence as the bistable stages of FIG. 2. Through the fifth pulse the voltage at the output terminal 49 remains at the high level. The sixth pulse causes the first, second, and third stages, 41, 42, and 43 to operate in the second operating state and the fourth stage 44 to operate in the first operating state whereby the voltage at the output terminal 49 changes to the low level. These conditions are the same as the operating conditions of the subsystem of FIG. 2 after application of the sixth pulse.

Subsequent input pulses cause the bistable stages to change operating states in the same pattern as described for FIG. 2. After the eleventh input pulse all of the stages are in the second operating state with the second flip-flop transistors "on" and the output terminal 49 at the high voltage level. Thus, the subsystem of FIG. 3 also provides a square wave output signal of one-tenth the frequency of the input signal.

*Conclusion*

The bistable circuit according to the invention provides a basic logic element which may be employed in multiple and combined with other elements to provide functional arrays. A complete subsystem as illustrated by the decade frequency dividers of FIGS. 2 and 3 is amenable to fabrication within a single chip of semiconductor material as an intergrated circuit network by virtue of the relatively small number of components and interconnections required. The control circuit provides high-speed triggering of the flip-flop sections; and by virtue of the exceptionally short interconnections when the entire subsystem is one chip of semiconductor material, there is a minimum of loading to delay switching of the flip-flop sections. Buffer circuits between stages are not needed to isolate stages, provide driving power, or adjust inputs and outputs to compatible levels. Since only one section of the nature of the output circuit is employed for isolating the subsystem from its output load and for driving the output load, total power consumption for the complete subsystem is low.

High speed operation of the bistable circuit is enhanced by the manner in which the switching transistor is cleared of the remaining stored charge as soon as the operating state of the circuit has been established. Since the charge is stored during the leading edge of the signal pulse and is not utilized to cause switching until the trailing edge, any differences in the switching speeds of the bistable circuits of an array will not lead to an improper operation of the subsystem.

The basic bistable circuit is very versatile in the manner in which connections can be made thereto and therefrom for controlling the switching action of the various stages in a complex functional array. These connections are compatible with each other and various arrangements may be employed to provide gating and inhibiting action between stages. The subsystems of FIGS. 2 and 3 illustrate the manner in which various interconnections may be made to provide decade frequency dividers. Other interconnecting patterns may be formed between the stages of an array to provide other logic subsystems.

While there has been shown and described what are considered preferred embodiments of the present invention, it will be obvious to those skilled in the art that various changes and modifications may be made therein without departing from the invention as defined in the appended claims.

What is claimed is:

1. A control circuit including in combination switching means having a first output connection therefrom and first and second input connections thereto, said swtiching means producing a first signal condition at the output connection when in a first operating condition and producing a second signal condition at the output connection when in a second operating condition, control means connected to the first input connection to the switching means and having a control input connection thereto, said control means being operable in a high impedance condition in response to the presence of a first signal condition at the control input connection and being operable in a low impedance condition in response to a second signal condition at the control input connection, impedance means connected to the first input connection to the switching means, triggering signal means connected to the impedance means and to the second input connection to the switching means, said triggering signal means, said impedance means, and said control means include means for providing, biasing at the first and second input connections to the switching means biasing the switching means to the first operating condition during the absence of a signal at the triggering signal means, biasing at the first and second input connections to the switching means biasing the switching means to the first operating condition during the presence of a signal at the triggering signal means when the control means is in the low impedance condition, and biasing at the first and second input connections to the switching means causing a charge to be stored in the switching means during the presence of a signal at the triggering signal means when the control means is in the high impedance condition, and said switching means being operable to employ the stored charge to cause operation of the switching means in the second operating condition in response to termination of the signal at the triggering signal means.

2. A control circuit including in combination a control transistor, a control input connection means connected to said control transistor and operable to bias the control transistor to a non-conducting condition during the presence of a first predetermined signal condition at the control input connection means, and operable to bias the control transistor to a conducting condition during the presence of a second predetermined signal condition at the control input connection means, an output connection, a switching transistor connected to the output connection, and input signal connection means connected to the switching transistor and to the control transistor for providing a charge to be stored in the switching transistor during the presence of a signal at the input signal connection means when the control transistor is in the non-conducting condition, and for permitting the stored charge to bias the switching transistor to conduction and produce a predetermined signal condition at the output connection in response to termination of the signal at the input signal connection means.

3. An input circuit for controlling the operating state of a flip-flop circuit including in combination a first section having a first control input connection for transmitting signals thereto indicative of the operating state of the flip-flop circuit and a first output connection therefrom, a second section having a second control input connection for transmitting signals thereto indicative of the operating state of the flip-flop circuit and a second output connection therefrom, first switching means in said first section connected to the first output connection and having first and second input connections thereto, said first switching means producing a first signal condition at the first output connection when in a first operating condition and producing a second signal condition at the first output connection for changing the operating state of the flip-flop circuit when in a second operating condition, first control means in said first section connected to the first control input connection and to the first input connection to the first switching means, said first control means being operable in a high impedance condition in response to the presence of a first signal condition at the first control input connection, and being operable in a low impedance condition in response to a second signal condition at the first control input connection, first impedance means connected to the first input connection to the first switching means, first triggering signal means connected to the first impedance means and to the second input connection to the first switching means, said first triggering signal means, said first impedance means, and said first control means being operable to produce biasing conditions at the first and second input connections to the first switching means biasing the first switching means to the first operating condition during the absence of a signal at the first triggering signal means, being operable to produce biasing conditions at the first and second input connections to the first switching means biasing the first switching means to the first operating condition during the absence of a signal at the first triggering signal means when the first control means is in the low impedance condition, and being operable to produce biasing conditions at the first and second input connections to the first switching means causing a charge to be stored in the first switching means during the presence of a signal at the first triggering signal means when the first control means is in the high impedance condition, said first switching means being operable to employ the stored charge to cause operation of the first switching means in the second operating condition in response to termination of the signal at said first triggering signal means, second switching means in said second section connected to the second output connection and having first and second input connections thereto, said second switching means producing a first signal condition at the second output connection when in a first operating condition and producing a second signal condition at the second output connection for changing the operating state of the flip-flop circuit when in a second operating condition, second control means in said second section connected to the second control input connection and to the first input connection to the second switching means, said second control means being operable in a high impedance condition in response to the presence of a first signal condition at the second control input connection, and being operable in a low impedance condition in response to a second signal condition at the second control input connection, second impedance means connected to the first input connection to the second switching means, second triggering signal means connected to the second impedance means and to the second input connection to the second switching means, said second triggering signal means, said second impedance means, and said second control means being operable to produce biasing conditions at the first and second input connections to the second switching means biasing the second switching means to the first operating condition during the absence of a signal at the second triggering signal means, being operable to produce biasing conditions at the first and second input connections to the second switching means biasing the second switching means to the first operating condition during the presence of a signal at the second triggering signal means when the second control means is in the low impedance condition, and being operable to produce biasing conditions at the first and second input connections to the second switching means causing a charge to be stored in the second switching means during the presence of a signal at the second triggering signal means when the second control means is in the high impedance condition, and said second switching means being operable to employ the stored charge to cause operation of the second switching means in the second operating condition in response to termination of the signal at said second triggering signal means.

4. A bistable circuit including in combination a first flip-flop section having a first operating condition and a second operating condition, a second flip-flop section having a first operating condition and a second operating condition, feedback connections between the first and second flip-flop sections for causing the flip-flop sections to operate in different operating conditions, a control circuit having control input connections from the first and second flip-flop sections and output connections to the first and second flip-flop sections, first switching means in said control circuit connected to a first output connection and having first and second input connections thereto, said first switching means producing a first signal condition at the first output connection when in a first operating condition and producing a second signal condition at the first output connection tending to switch the second flip-flop section to the first operating condition and the first flip-flop section to the second operating condition when in a second operating condition, first control means in said control circuit connected to a first control input connection and to the first input connection to the first switching means, said first control means being operable in a high impedance condition while the first flip-flop section is in the first operating condition and the second flip-flop section is in the second operating condition, and being operable in a low impedance condition while the first flip-flop section is in the second operating condition and the second flip-flop section is in the first operating condition, first impedance means connected to the first input connection to the first switching means, first triggering signal means connected to the first impedance means and to the second input connection to the first switching means, said first triggering signal means, said first impedance means, and said first control means being operable to produce biasing conditions at the first and second input connections to the first switching means biasing the first switching means to the first operating condition during the absence of a signal at the first triggering signal means, being operable to produce biasing conditions at the first and second input connections to the first switching means biasing the switching means to the first operating condition during the presence of a signal at the first triggering signal means when the first control means is in the low impedance condition, and being operable to produce biasing conditions at the first and second input connections to the first switching means causing a charge to be stored in the first switching means during the presence of a signal at the first triggering signal means when the first control means is in the high impedance condition, said first switching means being operable to employ the stored charge to cause operation of the first switching means in the second operating condition in response to termination of the signal at the first triggering signal means thereby switching the second flip-flop section to the first operating condition and the first flip-flop section to the second operating condition, second switching means in said control circuit connected to a second output connection and having first and second input connections thereto, said second switching means producing a first signal condition at the second output connection when in a first operating condition and producing a second signal condition at the first output connection tending to switch the first flip-flop section to the first operating condition and the second flip-flop section to the second operating condition when in a second operating condition, second control means in said control circuit connected to a second control input connection and to the first input connection to the second switching means, said second control means being operable in a high impedance condition while the second flip-flop section is in the first operating condition and the first flip-flop section is in the second operating condition, and being operable in a low impedance condition while the second flip-flop section is in the second operating condition and the first flip-flop section is in the first operating condition, second impedance means connected to the first input connection to the second switching means, second triggering signal means connected to the second impedance means and to the second input connection to the second switching means, said second triggering signal means, said second impedance means, and said second control means being operable to produce biasing conditions at the first and second input connections to the second switching means biasing the second switching means to the first operating condition during the absence of a signal at the second triggering signal means, being operable to produce biasing conditions at the first and second input connections to the second switching means biasing the switching means to the first operating condition during the presence of a signal at the second triggering signal means when the second control means is in the low impedance condition, and being operable to produce biasing conditions at the first and second input connections to the second switching means causing a charge to be stored in the second switching means during the presence of a signal at the second triggering signal means when the second control means is in the high impedance condition, and said second switching means being operable to employ the stored charge to cause operation of the second switching means in the second operating condition in response to termination of the signal at said second triggering signal means thereby switching the first flip-flop section to the first operating condition and the second flip-flop section to the second operating condition.

5. A bistable circuit according to claim 4 wherein said first control means includes inhibiting means operable in response to a signal thereto to cause the first control means to operate in the low impedance condition regardless of the operating conditions of the flip-flop sections.

6. A bistable circuit according to claim 4 wherein said first control means includes means for discharging any charge stored in the first switching means when the first control means operates in the low impedance condition upon switching of the first flip-flop section from the first operating condition to the second operating condition, and said second control means includes means for discharging any charge stored in the second switching means when the second control means operates in the low impedance condition upon switching of the second flip-flop section from the first operating condition to the second operating condition.

7. A bistable circuit according to claim 4 wherein said first switching means includes a first switching transistor having its collector connected to said first output connection, its base connected to the first input connection to the first switching means, and its emitter connected to the second input connection to the first switching means, said first switching transistor being in a non-conductive condition when the first switching means is in the first operating condition and being in a conductive condition when the first switching means is in the second operating condition, said first control means includes a first control transistor having its base connected to said first control input connection, its collector connected to the base of the first switching transistor, and its emitter connected to a source of reference potential, said first control transistor being biased to a non-conductive condition when the first flip-flop section is in the first operating condition and the second flip-flop section is in the second operating condition and being biased to a conductive condition when the first flip-flop section is in the second operating condition and the second flip-flop section is in the first operating condition, said first impedance means is a resistance connected between the base of the first switching transistor and the first triggering signal means, said second switching means includes a second switching transistor having its collector connected to said second output connection, its base connected to the first input connection to the second switching means, and its emitter connected to the second input connection to the second switching means, said second switching transistor being in a non-conductive condition when the second switching means is in the first operating condition and being in a conductive condition when the second switching means is in the second operating condition, said second control means includes a second control transistor having its base connected to said second control input connection, its collector connected to the base of the second switching transistor, and its emitter connected to the source of reference potential, said second control transistor being biased to a non-conductive condition when the second flip-flop section is in the first operating condition and the first flip-flop section is in the second operating condition and being biased to a conductive condition when the second flip-flop section is in the second operating condition and the first flip-flop section is in the first operating condition, and said second impedance means is a resistance connected between the base of the second switching transistor and the second triggering signal means.

8. A bistable circuit according to claim 7 wherein said first control means includes an inhibiting transistor having its collector connected to the collector of the first control transistor and its emitter connected to the emitter of the first control transistor, and including input means connected to the base of the inhibiting transistor and operable to bias the inhibiting transistor to the conducting condition during the presence of a predetermined signal condition at the input means.

9. A bistable circuit according to claim 7 wherein said first control means includes a multiple-emitter diode means having its base connected to the base of said first switching transistor and one of its emitters connected to the collector of said first control transistor, and including means for connecting means having a low impedance operating condition between another of the emitters of the multiple-emitter diode means and the source of reference potential.

10. A bistable circuit including in combination a first flip-flop section having a first operating condition and a second operating condition and producing a signal at first and second output connections indicative of the operating condition, a second flip-flop section having a first operating condition and a second operating condition and producing a signal at first and second output connections indicative of the operating condition, a first feedback connection from the first output connection of the first flip-flop section to the input of the second flip-flop section tending to cause the second flip-flop section to operate in the second operating condition when the first flip-flop section is in the first operating condition, a second feedback connection from the first output connection of the second flip-flop section to the input of the first flip-flop section tending to cause the first flip-flop section to operate in the second operating condition when the second flip-flop section is in the first operating condition, a control circuit having a first section and a second section, the first section of the control circuit having a first control input connection connected to the second output connection of the first flip-flop section and a first output connection connected to the input of the second flip-flop section, the second section of the control circuit having a second control input connection connected to the second output connection of the second flip-flop section and a second output connection connected to the input of the first flip-flop section, first switching means in the first section of the control circuit connected to the first output connection of the first section of the control circuit and having first and second input connections thereto, said first switching means producing a first signal condition at said first output connection when in a first operating condition and producing a second signal condition at said first output connection tending to switch the second flip-flop section to the first operating condition when in a second operating condition, first control means in the first section of the control circuit connected to the first control input connection and to the first input connection to the first switching means, said first control means being operable in a high impedance condition while the first flip-flop section is in the first operating condition, and being operable in a low impedance condition while the first flip-flop section is in the second operating condition, first impedance means connected to the first input connection to the first switching means, first triggering signal means connected to the first impedance means and to the second input connection to the first switching means, said first triggering signal means, said first impedance means, and said first control means being operable to produce biasing conditions at the first and second input connections to the first switching means biasing the first switching means to the first operating condition during the absence of a signal at the first triggering signal means, being operable to produce biasing conditions at the first and second input connections to the first switching means biasing the first switching means to the first operating condition during the presence of a signal at the first triggering signal means when the first control means is in the low impedance condition, and being operable to produce biasing conditions at the first and second input connections to the first switching means causing a charge to be stored in the first switching means during the presence of a signal at the first triggering signal means when the first control means is in the high impedance condition, said first switching means being operable to employ the stored charge to cause operation of the first switching means in the second operating condition in response to termination of the signal at the first triggering signal means thereby switching the second flip-flop section to the first operating condition and consequently switching the first flip-flop section to the second operating condition, second switching means in the second section of the control circuit connected to the second output connection of the second section of the control circuit and having first and second input connections thereto, said second switching means producing a first signal condition at said second output connection when in a first operating condition and producing a second signal condition at said second output connection tending to switch the first flip-flop section to the first operating condition when in a second operating condition, second control means in the second section of the control circuit connected to the second control input connection and to the first input connection to the second switching means, said second control means being operable in a high impedance condition while the second flip-flop section is in the first operating condition, and being operable in a low impedance condition while the second flip-flop section is in the second operating condition, second impedance means connected to the first input connection to the second switching means, second triggering signal means connected to the second impedance means and to the second input connection to the second switching means, said second triggering signal means, said second impedance means, and said second control means being operable to produce biasing conditions at the first and second input connections to the second switching means biasing the second switching means to the first operating condition during the absence of a signal at the second triggering signal means, being operable to produce biasing conditions at the first and second input connections to the second switching means biasing the second switching means to the first operating condition during the presence of a signal at the second triggering signal means when the second control means is in the low impedance condition, and being operable to produce biasing conditions at the first and second input connections to the second switching means causing a charge to be stored in the second switching means during the presence of a signal at the second triggering signal means when the second control means is in the high impedance condition, and said second switching means being operable to employ the stored charge to cause operation of the second switching means in the second operating condition in response to termination of the signal at the second triggering signal means thereby switching the first flip-flop section to the first operating condition and consequently switching the second flip-flop section to the second operating condition.

11. A bistable circuit according to claim 10 wherein said first control means includes inhibiting means operable in response to a signal thereto to cause the first control means to operate in the low impedance condition regardless of the operating condition of the first flip-flop section.

12. A bistable circuit according to claim 10 wherein said first control means includes means for discharging any charge stored in the first switching means when the first control means operates in the low impedance condition upon switching of the first flip-flop section from the first operating condition to the second operating condition, and said second control means includes means for discharging any charge stored in the second switching means when the second control means operates in the low impedance condition upon switching of the second flip-flop section from the first operating condition to the second operating condition.

13. A bistable circuit according to claim 10 wherein said first switching means includes a first switching transistor having its collector connected to said first output connection, its base connected to the first input connection to the first switching means, and its emitter connected to the second input connection to the first switching means, said first switching transistor being in a non-conductive condition when the first switching means is in the first operating condition and being in a conductive condition when the first switching means is in the second operating condition, said first control means includes a first control transistor having its base connected to said first control input connection, its collector connected to the base of the first switching transistor, and its emitter connected to a source of reference potential, said first control transistor being biased to a non-conductive condition when the first flip-flop section is in the first operating condition and being biased to a conductive condition when the first flip-flop section is in the second operating condition, said first impedance means is a resistance connected between the base of the first switching transistor and the first triggering signal means, said second switching means includes a second switching transistor having its collector connected to said second output connection, its base connected to the first input connection to the second switching means, and its emitter connected to the second input connection to the second switching means, said second switching transistor being in a non-conductive condition when the second switching means is in the first operating condition and being in a conductive condition when the second switching means is in the second operating condition, said second control means includes a second control transistor having its base connected to said second control input connection, its collector connected to the base of the second switching transistor, and its emitter connected to the source of reference potential, said second control transistor being biased to a non-conductive condition when the second flip-flop section is in the first operating condition and being biased to a conductive condition when the second flip-flop section is in the second operating condition, and said second impedance means is a resistance connected between the base of the second switching transistor and the second triggering signal means.

14. A bistable circuit according to claim 13 wherein said first control means includes an inhibiting transistor having its collector connected to the collector of the first control transistor and its emitter connected to the emitter of the first control transistor, and including input means connected to the base of inhibiting transistor and operable to bias the inhibiting transistor to the conducting condition during the presence of a predetermined signal condition at the input means.

15. A bistable circuit according to claim 13 wherein said first control means includes a multiple-emitter diode means having its base connected to the base of said first switching transistor and one of its emitters connected to the collector of said first control transistor, and including means for connecting means having a low impedance operating condition between another of the emitters of the multiple-emitter diode means and the source of reference potential.

16. A bistable circuit according to claim 10 wherein said first and second triggering signal means comprise a single signal input means having a first connection to said first impedance means and to said second impedance means and a second connection to said second input connection to the first switching means and to said second input connection to the second switching means.

17. A bistable circuit according to claim 13 wherein said first flip-flop section includes a first multiple-emitter input transistor having its base connected through a resistance to a second source of reference potential and a first of its emitters connected directly to the collector of said second switching transistor, and a first flip-flop transistor having its base connected directly to the collector of the first multiple-emitter input transistor and its emitter connected directly to the base of said first control transistor and through a resistance to the first-mentioned source of reference potential, said second flip-flop section includes a second multiple-emitter input transistor having its base connected through a resistance to the second source of reference potential and a first of its emitters connected directly to the collector of said first switching transistor, and a second flip-flop transistor having its base connected directly to the collector of the second multiple-emitter input transistor and its emitter connected directly to the base of said second control transistor and through a resistance to said first-mentioned source of reference potential, said first feedback connection is a direct connection from the collector of the first flip-flop transistor to a second of the emitters of the second multiple-emitter input transistor, and said second feedback connection is a direct connection from the collector of the second flip-flop transistor to a second of the emitters of the first multiple-emitter input transistor.

References Cited

UNITED STATES PATENTS

| | | | |
|---|---|---|---|
| 2,928,011 | 3/1960 | Campbell | 307—88.5 |
| 2,965,768 | 12/1960 | Wanlass | 307—88.5 |
| 3,345,521 | 10/1967 | Leenhouts | 307—88.5 |

JOHN S. HEYMAN, *Primary Examiner.*